(12) United States Patent
Fontius et al.

(10) Patent No.: US 7,622,921 B2
(45) Date of Patent: Nov. 24, 2009

(54) METHOD AND DEVICE FOR MONITORING RADIO-FREQUENCY EXPOSURE IN A MAGNETIC RESONANCE MEASUREMENT

(75) Inventors: Joerg Ulrich Fontius, Neunkirchen A. Brand (DE); Juergen Nistler, Erlangen (DE); Wolfgang Renz, Erlangen (DE); Franz Schmitt, Erlangen (DE); Karsten Wicklow, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 102 days.

(21) Appl. No.: 11/965,809

(22) Filed: Dec. 28, 2007

(65) Prior Publication Data

US 2008/0157765 A1 Jul. 3, 2008

(30) Foreign Application Priority Data

Dec. 28, 2006 (DE) .................. 10 2006 061 740

(51) Int. Cl.
*G01V 3/00* (2006.01)
(52) U.S. Cl. .................................. 324/307; 324/309
(58) Field of Classification Search ......... 324/300–322; 600/410–435
See application file for complete search history.

(56) References Cited

U.S. PATENT DOCUMENTS

| | | | | |
|---|---|---|---|---|
| 6,426,623 | B1 * | 7/2002 | Bernstein | 324/314 |
| 6,759,847 | B2 * | 7/2004 | Brinker et al. | 324/309 |
| 6,762,605 | B2 * | 7/2004 | Brinker et al. | 324/309 |
| 6,841,999 | B2 * | 1/2005 | Arneth et al. | 324/309 |
| 6,900,636 | B2 * | 5/2005 | Leussler | 324/318 |
| 7,187,172 | B2 * | 3/2007 | Bielmeier et al. | 324/314 |
| 7,340,225 | B2 * | 3/2008 | Bielmeier et al. | 455/115.1 |
| 7,342,398 | B2 * | 3/2008 | Bielmeier et al. | 324/314 |
| 7,355,404 | B1 * | 4/2008 | Hariharan et al. | 324/307 |

(Continued)

FOREIGN PATENT DOCUMENTS

WO    WO 2006/120589 A2    11/2006

OTHER PUBLICATIONS

"Spatial Resolution of Numerical Models of Man and Calculated Specific Absorption Rate Using the FDTD Method: A Study at 64 MHz in a Magnetic Resonance Imaging Coil," Collins et al, J. of Magnetic Resonance Imaging, vol. 18 (2003) pp. 383-388.

*Primary Examiner*—Brij B. Shrivastav
*Assistant Examiner*—Dixomara Vargas
(74) *Attorney, Agent, or Firm*—Schiff Hardin LLP

(57) ABSTRACT

In a method and device for monitoring the physiologically effective radio-frequency exposure in at least one specific volume region of an examination subject in a magnetic resonance data acquisition scan in a magnetic resonance system, amplitude values are acquired that respectively represent, at specific acquisition points in time, a signal amplitude of the radio-frequency signals emitted or to be emitted via the radio-frequency signal channels. Also, phase values are acquired that represent the phases of the appertaining radio-frequency signals at these points in time. Local exposure values are then determined on the basis of the amplitude values and phase values, respectively representing a physiological exposure that the radio-frequency pulses cause at the examination subject at a specific location at a specific time. Based on this, exposure control values are determined that are compared with predetermined exposure limit values. When an exposure limit values is reached or exceeded, a control signal is output.

13 Claims, 2 Drawing Sheets

U.S. PATENT DOCUMENTS

| | | | |
|---|---|---|---|
| 7,417,435 B2 * | 8/2008 | Diehl | 324/320 |
| 7,439,742 B2 * | 10/2008 | Fontius et al. | 324/318 |
| 7,474,877 B2 * | 1/2009 | Bielmeier et al. | 455/115.1 |
| 2005/0197077 A1 * | 9/2005 | Bielmeier et al. | 455/115.1 |
| 2007/0024283 A1 * | 2/2007 | Bielmeier et al. | 324/314 |

* cited by examiner

METHOD AND DEVICE FOR MONITORING RADIO-FREQUENCY EXPOSURE IN A MAGNETIC RESONANCE MEASUREMENT

BACKGROUND OF THE INVENTION

1. Field of the Invention

The present invention concerns a method for monitoring the physiologically effective radio-frequency exposure or in at least one specific volume region of an examination subject in a magnetic resonance measurement (i.e., data acquisition sequence or in a magnetic resonance system, the magnetic resonance system having a radio-frequency antenna structure with a number of individually controllable radio-frequency signal channels for generation of radio-frequency distributions in an examination volume including the examination subject. Moreover, the invention concerns a corresponding radio-frequency monitoring device for implementation of such a method as well as a magnetic resonance system with such a radio-frequency monitoring device.

2. Description of the Prior Art

Magnetic resonance tomography has in recent years become established as an imaging modality in the medical field. The method essentially proceeds in three steps: first a strong, stable, homogeneous magnetic field that produces a stable alignment of the protons in the appertaining body region is generated around the body region. This stable alignment is then altered by radiating electromagnetic radio-frequency energy. Third, this excitation is ended and the magnetic resonance signals arising in the body are detected with suitable acquisition coils in order to make conclusions about the tissue in this body region.

A magnetic resonance tomography system has a number of interacting components, each requiring the use of modern and complicated technologies. As noted above, in a magnetic resonance tomography system the emission of the electromagnetic radio-frequency signals (also called radio-frequency pulses in the following) is important. The radio-frequency pulses output by a radio-frequency power amplifier of the magnetic resonance system are conducted to a transmission radio-frequency antenna structure (also called a transmission antenna or antenna structure in the following) that radiates the radio-frequency pulses.

The antenna structure can be fashioned in many ways. A typical, classical design is known as a birdcage structure with a number of longitudinal rods running parallel to the patient in the longitudinal direction, which longitudinal rods are connected with one another at the end by annular conductors. In order to achieve an optimally good homogeneity of the radio-frequency field in at least one specific volume region, it would be desirable to be able to influence the radiated RF field distribution with optimal precision in a suitable manner at all points of the examination volume. The trend of future developments in the field of magnetic resonance systems therefore is moving toward using antenna structures with a number of individually controllable radio-frequency signal channels, for example with a number of separately controllable inputs or RF feed lines at one transmission antenna and/or with a number of separately controllable antenna elements within the antenna structure (known as transmission arrays). By the passive allocation of these various radio-frequency signal channels, various radio-frequency distributions (for example linearly independent modes) can be generated in the examination volume, the radio-frequency distributions overlapping in a defined manner. Nearly any arbitrary field distribution thus can be achieved by suitable adjustment of the signals on the various radio-frequency signal channels. An example of this is described in DE 101 24 465 A1, which describes an antenna structure for generation of radio-frequency fields in the examination volume of a magnetic resonance system that has a number of separately controllable antenna elements.

Limit values that control the maximum radio-frequency irradiation into a human body have been standardized with the development and establishment of magnetic resonance tomography systems to ensure patient safety. A typical limit value for this purpose is the maximum allowable SAR (specific absorption rate). To adhere to these limit values, measurement values that represent the power of the radio-frequency signals radiated to the antenna structure or from the antenna structure have conventionally been detected in the radio-frequency feed lines in the typical magnetic resonance systems. Power control values are formed on the basis of a number of such radio-frequency power values. These power control values are then compared with a fixed power control value predetermined by a standard, this fixed power control value being selected such that the predetermined SAR value is not exceeded. The emission of radio-frequency signals is then stopped or reduced when a control value exceeds the predetermined threshold.

This means that the maximum allowable SAR is conventionally converted into a maximum allowable power and this power limit value is monitored. However, the physiological effect of radio-frequency energy on a human or animal body depends on, among other things, the frequency and the type of the antenna, i.e. on whether the antenna emits, for example, in a circularly or linearly polarized manner or whether it is, for example, a volume coil or surface coil. Moreover, the effect also depends on the position of the antenna relative to the body of the patient. In the conventional monitoring methods very large safety intervals from the actual critical value therefore must be based in order to ensure 100% safety for the patient. The allowable power limit value consequently generally lies significantly lower than is actually necessary to adhere to the maximum exposure. Since a lower image quality normally accompanies lower radio-frequency power, it would be desirable to reduce this overly large safety interval. It must also be considered that a lower image quality ultimately leads to exposures possibly not offering the desired diagnosis possibilities, or even to exposures having to be re-acquired, which in turn leads to a higher exposure of the patient.

In order to solve this problem, in DE 10 2004 037 840 A1 it is proposed to initially convert the measurement values into exposure values that represent a physiological effect that the radio-frequency signals have on an examination subject exposed to these radio-frequency signals. Exposure control values are then formed based on a number of such physiological exposure values and these exposure control values are then monitored as to whether they reach or exceed an exposure limit value. The emission of radio-frequency signals is limited or interrupted when an exposure control value reaches or exceeds an exposure limit value. In this method as well, however, only the power of the emitted radio-frequency signals is measured.

Given the use of the aforementioned antenna structures with a number of separately controllable radio-frequency signal channels, however, a problem is that the radio-frequency power that ultimately acts on the examination subject (i.e. the patient or test subject) in most cases does not agree with the sum of the individual powers at the various radio-frequency signal channels, since constructive and destructive overlapping of the electrical fields of the individual radio-frequency signal channels occurs. As before, such systems must therefore be operated with overly large safety intervals.

SUMMARY OF THE INVENTION

An object of the present invention to improve the aforementioned method for monitoring the physiological effective radio-frequency exposure in a magnetic resonance measurement, as well as a corresponding radio-frequency monitoring device, so that, even given the use of radio-frequency antenna structures with a number of individually controllable radio-frequency signal channels, the radiated radio-frequency power exceeding a limit value that is dangerous for the patient/test subject is prevented, and an optimally good convergence to this safe limit value is achieved in order to be able to operate with optimally high transmission power within the safe limit values.

The above object is achieved in accordance with the present invention by a method for monitoring a physiologically effective radio-frequency exposure in a defined volume of an examination subject in a magnetic resonance data acquisition sequence in a magnetic resonance system having a multi-channel radio-frequency signal detecting system wherein, for each of the radio-frequency signal channels, an amplitude and a phase value are detected for the radio-frequency signal in that channel at a number of known acquisition points in time. For each of the acquisition points in time for each of the radio frequency signal channels, respective local exposure values are automatically calculated from the respective amplitude and phase values, these local exposure values respectively representing a physiological exposure caused by the radio-frequency at the known location in the examination volume. Also for each of the radio-frequency signal channels, exposure control values are automatically formed from the local exposure values. The respective exposure control values are compared with respective predetermined exposure limit values, and a control signal is generated that alters at least one of the radio-frequency signals if an exposure limit value is met or exceeded.

A basic feature of the invention is that, instead of the simple power of the radiated radio-frequency signals, amplitude values are detected that respectively represent, at specific acquisition points in time, a signal amplitude of the radio-frequency signals emitted or to be emitted via the individual radio-frequency signal channels in the course of the magnetic resonance measurement. According to the invention, additional phase values are acquired that represent the phases of the appertaining radio-frequency signals at these points in time. This means that each emitted signal is detected with regard to the amplitude and the phase relative to the other radio-frequency signals, the other radio-frequency signals are emitted, for example, simultaneously or temporally offset from one another. Local exposure values are subsequently determined on the basis of these amplitude values and phase values of the radio-frequency signals emitted or to be emitted. These local exposure values then represent the physiological exposure that the radio-frequency pulses overlapping in the examination volume have in total on the examination subject at a specific location, for example in a specific voxel or in a larger region composed of a number of voxels and at a specific time, for example at a precisely determined point in time or in a time interval. Exposure control values (such as, for example, a local SAR or global SAR) can then be determined for a specific point in time or a specific time span based on a number of such exposure values. These exposure control values can be compared with corresponding predetermined exposure limit values. When an exposure limit value is reached or exceeded, a control signal can be output in order to prevent or terminate a measurement or to intervene in another manner in the measurement workflow, or alter the workflow, such that the appertaining exposure limit value is not exceeded (again). Such a control signal can also include a warning signal to the operator.

In the inventive method, for example, the SAR limit value can be used directly as an exposure limit value insofar as the exposure values determined on the basis of the amplitude values and phase values of the radio-frequency signals emitted or to be emitted are calculated in the form of current SAR exposure values. Using these current SAR exposure control values, the exposure control values can then be formed in a similar manner as was previously implemented with the power control values, for example in that the exposure values being averaged and/or integrated over specific, legally predetermined time spans in order to form the exposure control value. In order to monitor a current peak exposure, however, only an individual current exposure value can be used as an exposure control value. One preferred possibility of the formation of the exposure control values is described below in further detail.

Since, in the inventive method, not only the power but also amplitudes and phases of the individual radio-frequency signals are acquired, these can be used to take into account the overlap of the fields at the various positions given known antenna structures (i.e. known antenna geometry, position of the connections of the feed lines within the geometry etc.) as well as known shape, structure and position of the examination subject within the examination volume in the determination of the local exposure values. Relatively precise local exposure values can be determined in this manner, such that ultimately the exposure control values based thereon also very precisely reflect the actual exposure. Even given complicated field distributions that are generated by arbitrary activation of the individual radio-frequency signal channels, it can be very precisely established when global exposure limit values and local exposure limit values could be exceeded. Measures can then be opportunely introduced beforehand in order to prevent this. Excessive safety intervals are thereby no longer required, such that measurements can be made with the optimal power within the safe limit values and thus a better image quality can be achieved.

An inventive radio-frequency monitoring device for implementation of such a method has an interface for the acquisition of amplitude values (which amplitude values respectively represent a signal amplitude, at specific points in time, of radio-frequency signals emitted and/or to be emitted via the radio-frequency signal channels in the course of the magnetic resonance measurement) and phase values (which represent the phases of the appertaining radio-frequency signals at these points in time). Furthermore, this radio-frequency monitoring device has an exposure value determination unit in order to determine local exposure values on the basis of the amplitude values and phase values of the radio-frequency pulses emitted or to be emitted, the local exposure values respectively representing a physiological exposure that the radio-frequency pulses produce at the examination subject at a specific location at a specific time. Furthermore, a control value generator is provided that forms exposure control values respectively based on a number of exposure values as well as a comparator in order to compare the exposure control values with predetermined exposure limit values. Finally, the radio-frequency monitoring device has a control signal output for output of a control signal when an exposure limit value is reached or exceeded.

The radio-frequency monitoring device is preferably used in a magnetic resonance system which has a radio-frequency antenna structure with a number of individually controllable radio-frequency signal channels (advantageously at least two individually controllable radio-frequency signal channels) and a corresponding radio-frequency device for emission of radio-frequency signals via the radio-frequency signal channels of the radio-frequency antenna structure. It is also possible to retrofit existing magnetic resonance systems with an inventive radio-frequency monitoring device. For this purpose, it is merely required that the magnetic resonance system have corresponding measurement elements in order to respectively acquire the amplitude values and phase values of the radio-frequency signals emitted by the individual radio-frequency signal channels, the amplitude values and phase values then being passed to the corresponding interface of the radio-frequency monitoring device. The components of the radio-frequency monitoring device (such as the exposure value determination unit, the control value generator or the comparator) can also be realized in the form of software components. Magnetic resonance systems are typically equipped with appropriate computers anyway, such computers serving for, among other things, monitoring of the radio-frequency exposure. It is then only necessary to update these components with a software update.

As mentioned, the method is particularly advantageous when different antenna elements of the antenna array can respectively be separately activated via the various radio-frequency signal channels. However, in principle radio-frequency antenna structures are also conceivable in which the radio-frequency signal channels are formed by various RF feed lines that are connected to an antenna element of the antenna structure, so different transmission modes that lead to different radio-frequency field distributions can be emitted via the parallel or short-term feed of radio-frequency signals over the various connections. The application of the inventive method is thus meaningful when it is assumed that the radio-frequency field distribution is not homogeneous over the entire volume region, but rather severe local differences can exist.

There are various possibilities for the determination of the amplitude values and phase values of the individual radio-frequency signals. The amplitude and/or phase can be measured by means of signal decoupling units (for example direction couplers).

Alternative or additionally, the amplitude values and/or phase values of the individual radio-frequency signals can be detected by signal sensor units (for example pick-up coils) that are arranged on the antenna structure, i.e. so close to the appertaining antenna elements of the individual radio-frequency signal channels that they acquire a signal which is representative for the signals emitted by the individual radio-frequency channels in order to determined the amplitude value or phase value.

The amplitude values and phase values of the radio-frequency signals emitted at a specific point in time can be directly detected with the aforementioned method. An "online monitoring" during a running magnetic resonance measurement is thus possible with the method.

However, for such an "online monitoring" it is also possible in principle to adopt the amplitude values and/or phase values that are predetermined by a measurement control unit responsible for the overall control of the system for implementation of the method, and to incorporate said amplitude values and/or phase values into the calculations. For reasons of safety, however, a counter-check with actual measured values is desirable.

The inventive method likewise also is suitable for monitoring a planned magnetic resonance measurement with regard to its physiologically active radio-frequency exposure before its implementation. For this purpose, the amplitude values and/or phase values of the radio-frequency signals that should be emitted in the course of the planned magnetic resonance measurement are used, and the local exposure values are determined on the basis of these planned amplitude values and/or phase values. The amplitude values and/or phase values only need to be passed in advance to an interface of the radio-frequency monitoring device, since these must be known anyway for generation of the radio-frequency signals. For example, these values can be adopted again by the measurement control unit.

In such an advance checking, a check can be made (before the actual measurement) as to whether it is expected that during the measurement the radio-frequency exposure could be so strong that the measurement must be limited or terminated. In this case the measurement can already be re-planned in advance in order to optimally obtain the same results with a lower radio-frequency exposure. The measurement already checked in advance can additionally be monitored "online" again with the inventive method.

The determination of the local exposure values on the basis of the amplitude values and phase values of the radio-frequency pulses emitted and/or to be emitted can ensue with the aid of a field calculation in which the electrical field strengths occurring at a specific location at a specific time due to the radio-frequency pulses emitted or to be emitted are calculated. It can hereby be simulated how the individual fields of the radio-frequency signals emitted via the separate radio-frequency signal channels locally overlap at a specific point in time.

Moreover, weighting factors that specify how the actual physiological exposure (for example the SAR exposure) is effective at a specific location for a specific tissue type within the patient/test subject advantageously enter into the local exposure values. For example, the weighting can be different in a tissue region of the patient which is strongly perfused and therefore has a relatively high heat capacity than in a tissue without strong perfusion. Such weighting factors can be stored in a databank in the manner of a library. In principle the weighting factors can thereby also exhibit a dependency on other parameters. For example, the maximum radio-frequency power that a patient tolerates without having to fear health effects can be dependent on, among other things, various environment parameters. Often a direct correlation exists between maximum radio-frequency power and climate values, for example temperature and/or the humidity of the direct environment of the patient. Such environment parameters can additionally or alternatively also be taken into account in the establishment of the exposure limit values.

Field distributions of the electrical fields and/or the magnetic fields that result upon an emission of a radio-frequency signal by the appertaining radio-frequency signal channels into an examination subject located at a specific position in the examination volume can already be provided in advance for the cited field calculation for the individual radio-frequency signal channels. These calculations are relatively elaborate and complicated and are therefore reasonably implemented in advance and stored in a suitable memory device, which the exposure value determination unit can access for a later calculation of the exposure values.

As mentioned above, the electrical field distributions and/or magnetic field distributions (also called single field distributions in the following) that are respectively generated at the individual positions upon the emission of radio-frequency signals by the individual radio-frequency signal channels depend on the geometry of the antenna structure (i.e. their precise design as well as the connections of the feed line etc.). Additionally, these single field distributions in the examination subject are dependent on the geometry and position of the examination subject at the time at the respective location, as well as the body type of the subject. For example, it must be considered whether the patient is an adult or a child or whether the patient is female or male. Mass and weight of the patient likewise are among the parameters that influence the fields. The advance calculations of the electrical and/or the magnetic field distributions for the individual radio-frequency signal channels are therefore preferably implemented on the basis of an antenna model (the optimally precisely mirrors the antenna structure of the employed magnetic resonance system) and an examination subject model (that represents the examination subject, i.e. the patient and/or test subject) to be examined. The calculations on the basis of such models can be implemented, for example, using a finite element model or a simulation known as an FDTD (Finite Distance Time Domain) simulation. In practice, commercially available software (for example CST MicroWave Studio® of the company Sonnet Software, Inc.) can be used for this purpose, but the data for the antenna model and the patient model must still be input in order to calculate the desired single field distributions. An example for a patient model that is suitable is the frequently-employed "HUGO Anatomical Data Set" by Medical Virtual Reality Studio GmbH.

However, these calculations presently require multiple days per model. It is therefore desirable to implement the calculations of the single field distributions therefore in advance for a number of patient model types, and to store the results in a type of library. For the RF exposure monitoring, the single field distributions (calculated in advance) in which a patient model was used that optimally resembles the real patient can then be selected for implementation of the calculations for a specific patient. With this method, the inventive monitoring can be implemented for a number of patients without burdensome computing effort. Only in individual cases is an elaborate calculation of the single field distributions adapted specifically to the patient necessary in advance, and the recalculations generated for these individual cases can likewise be stored in the library so as to be available again for subsequent similar cases.

A time window that slides or shifts in the time range over the measurement values (or exposure values determined therefrom) is advantageously used in the determination of the exposure control values from multiple exposure values. The exposure control values used for the comparison with the exposure limit value (which exposure control values are each based on a number of measurement values or exposure values in the respectively considered time window) thus very promptly reflect the actual radiation exposure for a patient that occurred in the previous time span.

In a preferred exemplary embodiment, monitoring of the exposure values (and thus of the radio-frequency power) ensues using various interleaved time windows meaning. For example, a short-term monitoring and a long-term monitoring can be implemented. Exposure control values are thereby determined simultaneously for a number of time windows of different lengths (advantageously for two time windows of 10 s and 360 s) and compared with exposure limit values valid for the respective time spans. The exposure control value for a very specific short point in time (peak value) can additionally be compared with a corresponding peak exposure limit value. The measurement is then prevented or limited or terminated as soon as one of the exposure control values reaches or exceeds the associated exposure limit value.

This method serves to monitor the radiation of a specific higher dose over a longer time window and simultaneously to ensure that the entire power allowable within the long time window to be monitored is not radiated at the patient within a short time window (and thus a danger exists for the patient due to the short-term exposure super-elevation).

In order to be able to operate independently of any time period, an exposure control value can be generated based on the sum of a number of exposure values that are respectively weighted with an interval length between the measurement of two successive measurement values. For example, an exposure value is multiplied with the interval length between the previous measurement and the appertaining measurement. In this way, the exposure values in the time window to be observed are integrated according to extent and, for example, an exposure average is calculated therefrom.

DESCRIPTION OF THE PREFERRED EMBODIMENTS

Figure 1:
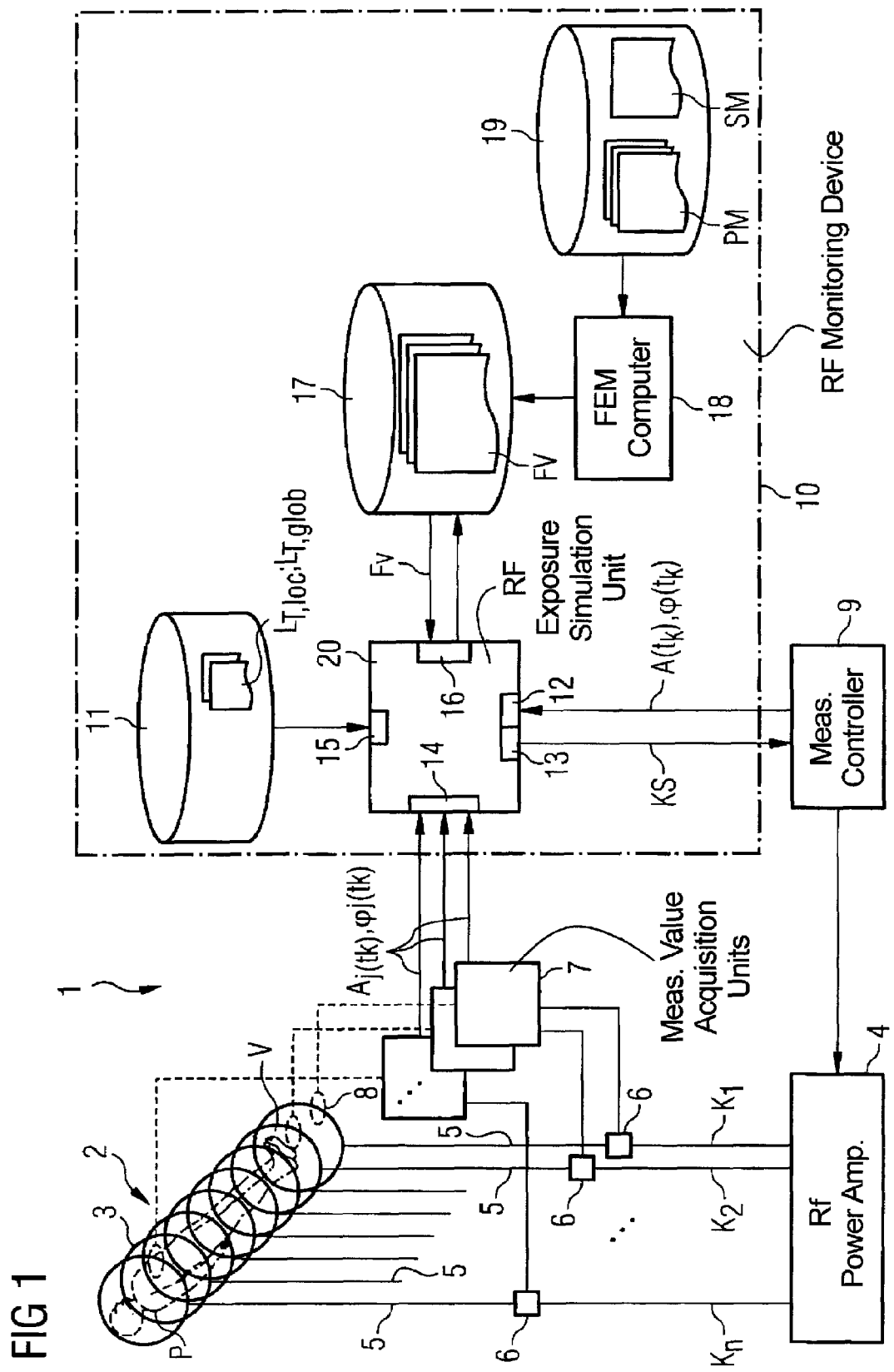
FIG. 1 is a schematic circuit diagram of a magnetic resonance system with an exemplary embodiment of an inventive radio-frequency monitoring device.

As an important component of a magnetic resonance system 1, FIG. 1 schematically shows an antenna structure 2 that encloses an examination volume V in which an examination subject P (here a patient P) is located. The antenna structure 2 includes a number of individual antenna elements 3 that are represented in FIG. 1 as individual annular coils, but the antenna structure can be fashioned differently. The antenna elements 3 are respectively connected via separate antenna feed lines 5 (also called feed lines) with a radio-frequency power amplifier 4 that delivers radio-frequency signals in a power range between 10 watts and 20 kW for the antenna elements 3. The individual antenna elements 3, together with their associated antenna feed lines 5, respectively form radio-frequency signal channels $K_1, K_2, \ldots, K_n$ (also called "transmission channels" in the following). Each transmission channel $K_1, K_2, \ldots, K_n$ is separately controlled by the radio-frequency power amplifier 4, meaning that a radio-frequency signal with a specific amplitude and phase can be individually emitted on each transmission channel $K_1, K_2, \ldots, K_n$ in order to generate arbitrarily (selectively) shaped radio-frequency fields in the examination volume V.

In addition to the transmission branch, the magnetic resonance system 1 also has a magnet system (not shown in the drawing) for generation of a basic magnetic field as well as gradient coils (likewise not shown) for the application of magnetic field gradients. Moreover, a radio-frequency acquisition system (not shown) with at least one acquisition coil and a suitable acquisition amplifier is present; transmission antenna elements 3 can also form the acquisition coils thereof. An image computer (not shown) reconstructs images from the acquired signals in order to be able to present these (for example on a screen) and/or store them in a memory.

A measurement controller 9 serves for coordination of the interaction of the individual components, and thus also for controlling the radio-frequency power amplifier 4. The measurement controller 9 is, for example, controllable in a typical manner by the operator via a user interface with monitor, keyboard, mouse, etc. Among other things, the workflow of the individual measurements is monitored in the measurement controller 9 on the basis of predetermined measurement protocols and, in addition to the emission of the radio-frequency pulses, the switching of the magnetic field gradients (not shown) at the tomography apparatus is also suitably controlled so that the desired measurements are implemented.

Signal decoupling units 6 (here in the form of directional couplers 6) are located within the feed lines, for example units known as TALES (Transmit Antenna Level Sensor), with which measurement values that represent the amplitude and phase of the emitted radio-frequency pulses are respectively acquired by measurement value acquisition units 7. Alternatively, corresponding values can also be measured by signal sensor units 8 (here in the form of pick-up coils 8) that are arranged close to the antenna elements 3 (drawn dashed in FIG. 1 as an alternative). The amplitude values $A_j(t_k)$ and phase values $\phi_j(t_k)$ detected from the individual pulses at a specific point in time $t_k$ (whereby j is an index that designates the $j^{th}$ radio-frequency signal) are passed to a radio-frequency exposure simulation unit 20 of a radio-frequency monitoring device 10. For this the radio-frequency exposure simulation unit 20 comprises an interface 14 in order to accept the amplitude values $A_j(t_k)$ and phase values $\phi_j(t_k)$. Alternatively, the radio-frequency exposure simulation unit 20 can also accept corresponding amplitude values $A_j(t_k)$ and phase values $\phi_j(t_k)$ from the measurement control unit 9 via an interface 12. In an online monitoring during a running measurement these can be used for monitoring of (comparison with) the measured values. Alternatively, a complete measurement can also be simulated in advance with regard to the radio-frequency exposure in order to establish before the start of the measurement whether the danger that exposure limit values are exceeded is present.

A control signal KS (here, for example, a stop signal KS) is output by the radio-frequency exposure simulation unit to the measurement controller 9 via an interface 13 when an exposure limit value is reached or exceeded, and given an online monitoring the corresponding measurement is then terminated or at least the radio-frequency power is correspondingly reduced. Given an offline monitoring, i.e. an advance checking of a planned measurement, a corresponding communication is output by the measurement controller via the operator terminal, for example, to the effect that the exposure limit values are not adhered to in this measurement, such that the operator can re-planned the measurement. If applicable a more suitable measurement protocol is also selected by the measurement controller and this is alternatively offered to the operator.

Figure 2:
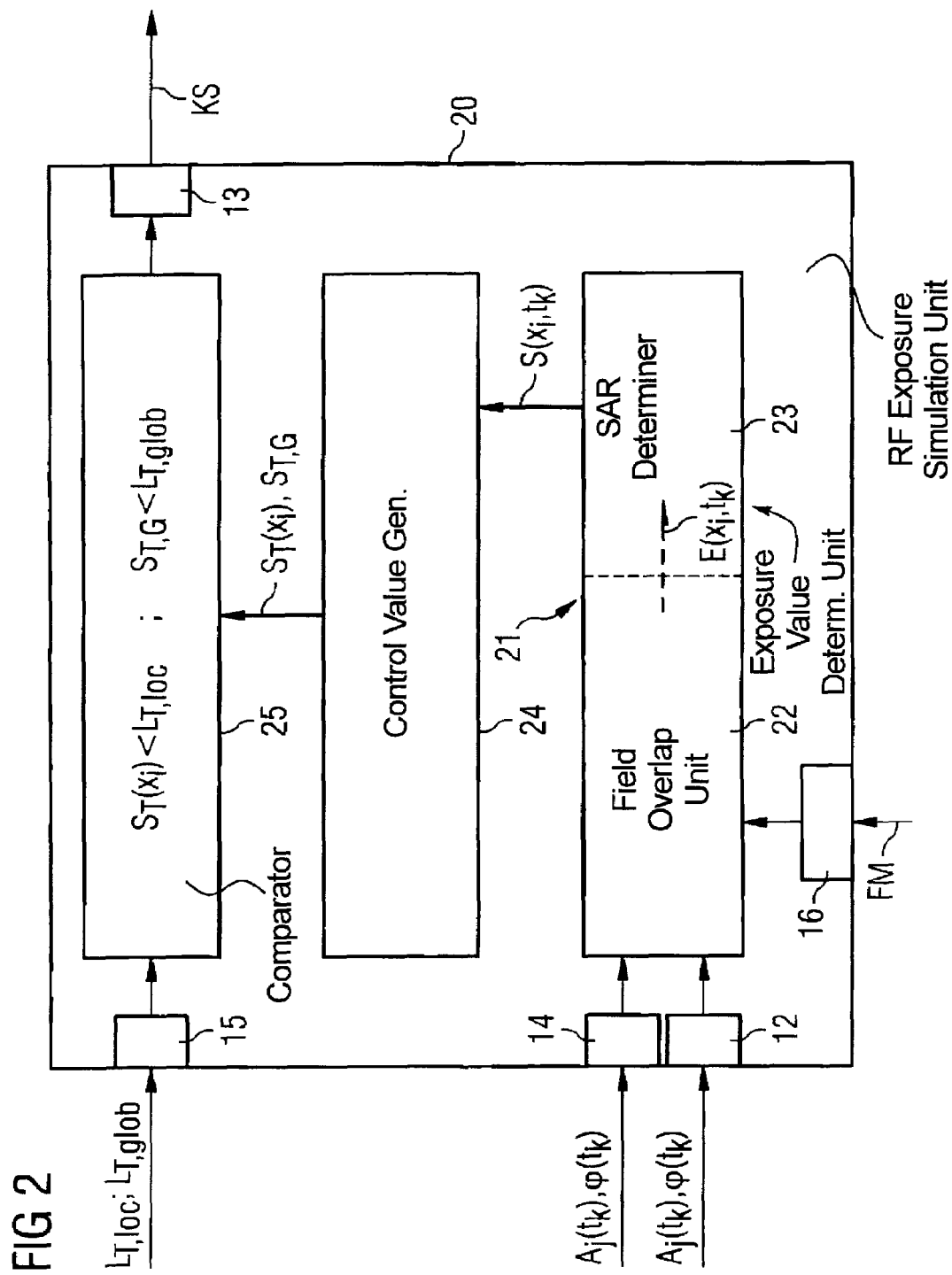
FIG. 2 is a more detailed representation of the radio-frequency exposure simulation unit from FIG. 1.

The mode of operation of the radio-frequency exposure simulation unit 20 is explained in more detail using FIG. 2. As shown, the radio-frequency exposure simulation unit 20 has a number of components; all components can be realized either in the form of software or in the form of hardware. A software realization has the advantage of being more cost-effective and a retrofitting of already-existing radio-frequency monitoring devices is more easily possible. This particularly applies for an advance simulation of exposures that could occur during a planned measurement. By contrast, a radio-frequency exposure simulation unit designed at least in part in the form of hardware has the advantage of operating significantly faster and therefore is even better suited for an online monitoring during a measurement (MR data acquisition).

A first component of this radio-frequency exposure simulation unit 20 is an exposure value determination unit 21 which here comprises two sub-components. The first sub-unit is a field overlap unit 22 and the second sub-unit is an SAR determiner 23. Depending on whether the monitoring is an online monitoring or an advance checking, the field overlap unit 22 receives the individual amplitude values $A_j(t_k)$ and phase values $\phi_j(t_k)$ of the individual pulses j via the interface 14 from the measurement value acquisition units 7 or via the interface 12 from the measurement controller 9. The field overlap unit 22 additionally receives the field distributions FV of the individual electrical fields and magnetic fields for each individual antenna element 3 via an interface 16. These field distributions FV for the individual antenna elements 3 have previously been determined in a relatively complicated calculation and been stored in a memory unit 17. FIG. 1 is referenced again in this regard.

A databank with various field distributions FV for a large number of examination situations (i.e. for examinations with specific patient types in specific positions or orientations) is stored in the memory unit 17. The radio-frequency exposure simulation unit 20 can search this databank in the memory unit 17 and retrieve field distributions FV as needed.

For the construction of this databank, the field distributions are calculated with a technique known as a finite element method (FEM) for patient models PM formed for various patient types and a coil model SM which optimally precisely corresponds to the antenna structure of the present magnetic resonance system. This can ensue in a separate FEM computer 18 that retrieves the patient models PM and the coil model SM from a memory unit 19. The memory units 17 and 19 can be realized in one and the same storage device, whereby correspondingly different memory regions are available for the individual field distributions FV and models PM, SM. The FEM computer 18 can be a typical computer at which the FEM calculations can be implemented with known, commercially-available programs (such as the Microwave Studio® mentioned above). Since these calculations are known in principle to those skilled in the art, they do not need to be discussed further herein.

With typical computers, the calculations currently take multiple days for a single patient model. An advance calculation of a number of standard models and storage of these in a databank is therefore advantageous. In principle, however, it is also possible to use a patient model specifically constructed for the appertaining patient for the FEM calculations (insofar as a measurement is planned far enough in advance) in order to obtain a field distribution optimally exactly approaching the real field distribution for the further calculations of the radio-frequency exposure simulation unit.

On the basis of the known field distribution for the individual antenna elements 3, the actual electrical field strength $E(x_i,t_k)$ present at a specific location $x_i$ ("x" designates a vector) at a point in time $t_k$ can then be calculated with the equation $$(x_i) \cdot i\varphi(x_i) = \sum_{=} () \cdot i\varphi() \cdot (x_i) \cdot i\varphi(x_i), \qquad (1)$$

whereby a phase factor $$i\phi(x_i) \qquad (2)$$

is accounted for which specifies the total phase $\phi(x_i,t_k)$ of the E-field at the respective location $x_i$ at the time $t_k$. For reasons of simplicity, the exemplary embodiment explained here is calculated with a scalar electrical field strength. It is clear that the calculations can be expanded corresponding to a higher dimensional space.

With the electrical field strength $E(x_i,t_k)$ calculated according to equation (1) at a specific location at a specific point in time, which electrical field strength is a very good estimation of the actual existing field given correspondingly careful selection of the patient model and consideration of the position of the patient relative to the antenna, a local exposure value $S(x_i,t_k)$ can then be calculated within the SAR determination unit 23 according to the following equation:

$$(x_i) = (x) \cdot (x_i) \qquad (3).$$

As can be recognized in this equation, the exposure value $S(x_i,t_k)$ is proportional to the square of the electrical field strength $E(x_i,t_k)$ calculated according to equation (1), such that the total phase in the result term from equation (1) averages out again. The square of the field strength $E(x_i,t_k)$ is thereby weighted with a weighting factor $s(x,t_k)$ that likewise depends on location and point in time. This weighting factor $S(x,t_k)$ provides for the conversion of the electrical field load into the physiological load and can, for example, be selected according to predetermined standards (in particular according to given tissue parameters).

In the present case it is assumed that an exposure limit value according to the presently applicable IEC (International Electrotechnical Commission) SAR standards is used. The weighting factor can be selected spatially dependent as here when it should be taken into account that the SAR exposure can also be dependent on the appertaining tissue type at this location. For example, the SAR exposure in adipose tissue is thus different than in significantly perfused muscle tissue etc. However, in the simplest case a constant weighting factor $s_0$ can also be assumed.

The exposure values $S(x_i,t_k)$ are recalculated in short intervals at every point in time $t_k$ and passed to a control value generator 24. The time period $t_k$ should be sufficient short so that phase and/or amplitude change can be detected within one RF pulse. Various control values ($S_T(x_i), S_{T,G}$) are formed by this control value generator 24. A local SAR value is calculated according to the equation $$(x_i) = \sum^{+} (x_i). \qquad (4)$$

All exposure values $S(x_i,t_k)$ are hereby simply added up across all temporal measurement points $t_k$ in the interval T. The value T can thereby be selected such that, for example, a time span of 10 seconds or of 360 s is acquired in order to be able to check corresponding local measurement values for these time spans according to the IEC standards. The peak value (i.e. precisely one single exposure value at a specific point in time $t_k$) itself can thereby also be considered as an exposure control value and thus a limit value can also be monitored with regard to a single exposure value. This value ultimately corresponds to the result from equation (4) with T=0.

An additional summation across all locations $x_i$ yields a global control value $S_{TG}$ for the appertaining time spans according to equation $$= \sum_i (x_i). \qquad (5)$$

These local control values $S(x_i)$ and global control values $S_{T,G}$ can also be recalculated at any point in time $t_k$. It is thus achieved that a sliding average is formed and the current average exposures exist as control values at any time.

The control values $S_T(x_i), S_{T,G}$ are then transmitted to a comparator 25 which compares the control values $S_T(x_i), S_{T,G}$ with corresponding limit values $L_{T,loc}, L_{T,glob}$. These limit values $L_{T,loc}, L_{T,glob}$ are retrieved by the RF exposure simulation unit via the interface 15, for example also from the memory unit 11. This memory unit 11 can also be part of the radio-frequency exposure simulation unit 20, or it can be a memory region within a memory used for other purposes.

In the present case the exposure limit values $L_{T,loc}, L_{T,glob}$ are the IEC limits for a peak exposure (peak; that which corresponds to a value T=0), a limit value for a time span of 10 s and a further limit value for a time span of 360 s (T is then respectively selected such that the time span corresponds to 10 s or, respectively, 360 s). A local limit value and a global limit value are thereby respectively considered. The local control value $S_T(X_i)$ is then compared with the local limit value $L_{loc,T}$ and the global exposure value $S_{T,G}$ is compared with the global limit value $L_{glob,T}$.

As soon as any control value $S_T(x_i), S_{T,G}$ exceeds one of the associated exposure limit values ($L_{T,loc}, L_{T,glob}$), the control signal KS is output via the interface 13, for example in the form of a stop signal to the measurement controller 9 given a monitoring of a currently running measurement.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for monitoring a physiologically effective radio-frequency exposure in a defined volume of an examination subject in a magnetic resonance data acquisition sequence in a magnetic resonance system, said magnetic resonance system comprising a radio-frequency antenna structure having a plurality of individually controllable radio-frequency signal channels that collectively generate a radio-frequency field distribution in an examination volume in which the examination subject is disposed during said sequence, each of said radio-frequency channels having a radio-frequency signal associated therewith selected from the group consisting of a radio-frequency signal emitted by that radio-frequency channel in said sequence and a radio-frequency signal to be emitted by that radio-frequency signal channel in said sequence, said method comprising the steps of:

for each of said radio-frequency signal channels, detecting an amplitude value and a phase value of the radio-frequency signal associated therewith at a plurality of known acquisition points in time;

for each of said known acquisition points in time for each of said radio-frequency signal channels, automatically electronically determining respective local exposure values from the respective amplitude and phase values, the local exposure values respectively representing a physiological exposure caused by the radio-frequency signal at a known location in the examination volume;

for each of said radio-frequency signal channels, automatically electronically forming exposure control values from the local exposure values;

comparing the respective exposure control values with respective predetermined exposure limit values; and generating a control signal that alters at least one of said radio-frequency signals if an exposure limit value is met or exceeded.

2. A method as claimed in claim 1 comprising separately controlling generation of the radio-frequency signals of the radio-frequency channels.

3. A method as claimed in claim 1 wherein each of said radio-frequency signal channels comprises an antenna feed line, and comprising detecting at least one of said amplitude values and said phase values via respective decoupling units in the respective antenna feed lines.

4. A method as claimed in claim 1 comprising detecting at least one of said amplitude values and said phase values using signal sensor units associated with said antenna structure.

5. A method as claimed in claim 1 wherein said radio-frequency signals are said radio-frequency signals to be emitted, and comprising checking a planned magnetic resonance data acquisition with regard to a physiological effective radio-frequency exposure that will be produced thereby before implementing said planned magnetic resonance data acquisition by modifying said at least one radio-frequency signal in advance of executing said planned magnetic resonance data acquisition.

6. A method as claimed in claim 1 comprising determining at least one of said amplitude values and said phase values by a field calculation in which respective electrical field strengths that occur at said known locations at said known acquisition points in time are automatically electronically calculated.

7. A method as claimed in claim 6 wherein said radio-frequency signals are said signals to be emitted by the respective radio-frequency channels, and calculating said electrical field strengths in advance of executing a magnetic resonance data acquisition sequence in which said electrical field distributions will be generated.

8. A method as claimed in claim 7 comprising calculating said electrical field distributions using an antenna model that models said antenna structure and an examination subject model that models said examination subject.

9. A method as claimed in claim 1 comprising generating each exposure control value from a sum of a plurality of said exposure values for a respective radio-frequency signal channel that occur within a predetermined time window.

10. A method as claimed in claim 9 wherein said radio-frequency signals are said signals emitted by the respective radio-frequency channels, and comprising weighting said sum dependent on a time duration between emission of said radio-frequency signals.

11. A method as claimed in claim 9 comprising shifting said time window over said exposure values within a predetermined time period.

12. A radio-frequency monitoring device for monitoring a physiologically effective radio-frequency exposure in a defined volume of an examination subject in a magnetic resonance data acquisition sequence in a magnetic resonance system, said magnetic resonance system comprising a radio-frequency antenna structure having a plurality of individually controllable radio-frequency signal channels that collectively generate a radio-frequency field distribution in an examination volume in which the examination subject is disposed in said sequence, each of said radio-frequency channels having a radio-frequency signal associated therewith selected from the group consisting of a radio-frequency signal emitted by that radio-frequency channel in said sequence and a radio-frequency signal to be emitted by that radio-frequency signal channel in said sequence, said radio-frequency monitoring device comprising:

a detection arrangement that, for each of said radio-frequency signal channels, detects an amplitude value and a phase value of the radio-frequency signal associated therewith at a plurality of known acquisition points in time; and a processor that, for each of said known acquisition points in time for each of said radio-frequency signal channels, automatically determines respective local exposure values from the respective amplitude and phase values, the local exposure values respectively representing a physiological exposure caused by the radio-frequency signal at a known location in the examination volume, and that, for each of said radio-frequency signal channels, automatically forms exposure control values from the local exposure values, and that compares the respective exposure control values with respective predetermined exposure limit values, and that generates a control signal that alters at least one of said radio-frequency signals if an exposure limit value is met or exceeded.

13. A magnetic resonance system comprising:

a magnetic resonance data acquisition unit configured to receive an examination subject in an examination volume therein;

a system controller that operates said data acquisition unit to acquire magnetic resonance data from a defined volume of the examination subject in the examination volume of the data acquisition unit;

said magnetic resonance data acquisition unit comprising a radio-frequency antenna structure having a plurality of individually controllable radio-frequency signal channels that collectively generate a radio-frequency field distribution in the examination volume in which the examination subject is disposed in said sequence, each of said radio-frequency channels having a radio-frequency signal associated therewith selected from the group consisting of a radio-frequency signal emitted by that radio-frequency channel in said sequence; and for each of said radio-frequency signal channels, detecting an amplitude value and a phase value of the radio-frequency signal associated therewith at a plurality of known acquisition points in time;

for each of said known acquisitions points in time for each of said radio-frequency signal channels, automatically electronically determining respective local exposure values from the respective amplitude and phrase values, the local exposure values respectively representing a physiological exposure caused by the radio-frequency signal at a known location in the examination volume;

for each of said radio-frequency signal channels, automatically electronically forming exposure control values from the local exposure values;

comparing the respective exposure control values with respective predetermined exposure limit values; and generating a control signal that alters at least one of said radio-frequency signals if an exposure limit value is met or exceeded.

* * * * *